United States Patent
Filipovic

(10) Patent No.: US 7,844,239 B2
(45) Date of Patent: Nov. 30, 2010

(54) DC REMOVAL TECHNIQUES FOR WIRELESS NETWORKING

(75) Inventor: Daniel F. Filipovic, Solana Beach, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 800 days.

(21) Appl. No.: 11/692,007

(22) Filed: Mar. 27, 2007

(65) Prior Publication Data

US 2007/0190957 A1     Aug. 16, 2007

Related U.S. Application Data

(63) Continuation of application No. 10/133,915, filed on Apr. 26, 2002, now Pat. No. 7,212,797.

(51) Int. Cl.
   *G06F 15/16*     (2006.01)
(52) U.S. Cl. .................... 455/234.2; 455/234.1
(58) Field of Classification Search ............. 455/232.1, 455/234.1, 234.2, 240.1, 313, 296; 375/319; 327/307
See application file for complete search history.

(56) References Cited

U.S. PATENT DOCUMENTS

| | | | | |
|---|---|---|---|---|
| 6,498,929 | B1 * | 12/2002 | Tsurumi et al. | 455/296 |
| 6,654,593 | B1 * | 11/2003 | Simmons et al. | 455/234.1 |
| 2002/0160734 | A1 * | 10/2002 | Li et al. | 455/245.1 |
| 2003/0199264 | A1 * | 10/2003 | Holenstein et al. | 455/295 |

* cited by examiner

*Primary Examiner*—Sam Bhattacharya
(74) *Attorney, Agent, or Firm*—Howard H. Seo; William M. Hooks

(57) ABSTRACT

A wireless communication device (WCD) performs DC removal on a received signal using a coarse DC removal unit that removes relatively large DC components and a fine DC removal loop that removes residual DC components. The coarse DC removal unit can be implemented in a receiver, and the fine DC removal loop can be implemented in a modem. In addition, a coarse DC estimation loop implemented on the modem may be coupled to the coarse DC removal unit to update DC offset values stored in the DC removal unit. By storing coarse DC offset values locally on the receiver, DC removal can be achieved very quickly.

19 Claims, 6 Drawing Sheets

DC REMOVAL TECHNIQUES FOR WIRELESS NETWORKING

The present Application for Patent is a continuation of patent application Ser. No. 10/133,915 entitled "DC REMOVAL TECHNIQUES FOR WIRELESS NETWORKING" filed Apr. 26, 2002, pending, and assigned to the assignee hereof and hereby expressly incorporated by reference herein.

FIELD

This disclosure relates to wireless communication and, more particularly, to wireless local area network (WLAN) systems.

BACKGROUND

Wireless networks allow computing devices to share information and resources via wireless communications. Examples of computing devices used in wireless networks include laptop or desktop computers, personal digital assistants (PDAs), mobile phones such as cellular radiotelephones and satellite radiotelephones, data terminals, data collection devices, personal digital assistants (PDAs) and other portable and non-portable computing devices. One broad family of standards developed to facilitate wireless networking is set forth in the IEEE 802.11 standard. The original IEEE 802.11 standard provides data transfer rates of 1-2 Megabits per second (Mbps) in a 2.4-2.483 Gigahertz (GHz) frequency band (hereafter the 2.4 GHz band). However, a number of extensions to the original IEEE 802.11 standard have been developed in an effort to increase data transfer rates.

The IEEE 802.11b standard (sometimes referred to as 802.11 wireless fidelity or 802.11 Wi-Fi) is an extension of the IEEE 802.11 standard that provides 11 Mbps transmission (with a fallback to 5.5, 2.0 and 1.0 Mbps) in the 2.4 GHz band. The IEEE 802.11b standard utilizes binary phase shift keying (BPSK) for 1.0 Mbps transmission, and quadrature phase shift keying (QPSK) for 2.0, 5.5 and 11.0 Mbps transmission. Complimentary code keying (CCK) techniques are also employed by 802.11b in order to achieve multi-channel operation in the 2.4 GHz band for the 5.0 and 11.0 Mbps transmission rates.

The IEEE 802.11g standard is another extension of the IEEE 802.11 standard. The IEEE 802.11g standard utilizes orthogonal frequency division multiplexing (OFDM) in the 2.4 GHz frequency band to provide data transmission at rates up to 54 Mbps. The IEEE 802.11g standard also provides backwards capability with 802.11b networks. The IEEE 802.11a standard is an extension of IEEE 802.11 standard that utilizes OFDM in a 5 GHz frequency band to provide data transmission at rates up to 54 Mbps. These and other wireless networks have been developed. Additional extensions to the IEEE 802.11 standard, as well as other WLAN standards will likely emerge in the future.

Wireless networks may contain one or more access points that interface with wireless and/or wired networks. Access points may also interface wirelessly with other access points to extend the geographical size of the wireless network. In addition, wireless routers may be used in wireless networks to perform data routing functions within the wireless setting. Sometimes, both wireless routers and access points are used together to form a relatively large wireless network environment.

Wireless communication devices that support wireless networking standards may also support other communication standards, such as standards commonly used for voice communications. The voice communication standards may be based on one or more of a variety of modulation techniques, such as frequency division multiple access (FDMA), time division multiple access (TDMA), and various spread spectrum techniques. One common spread spectrum technique used in wireless voice communication is code division multiple access (CDMA) signal modulation. In CDMA, multiple communications are simultaneously transmitted over a spread spectrum radio frequency (RF) signal. Other wireless communication systems may use different modulation techniques. For example, GSM systems use a combination of TDMA and FDMA modulation techniques. These techniques are also used in other systems related to GSM systems, including the DCS1800 and PCS1900 systems, which operate at 1.8 GHz and 1.9 GHz, respectively.

Due to constraints imposed by the wireless specifications, a signal of a WLAN system may need to be acquired more quickly than signals associated with most voice communication systems. For example, in a 802.11b WLAN system, a data packet is preceded by an approximately 56 microsecond (µs) synchronization preamble. Of this 56 µs preamble, the wireless communication device (WCD) may be allocated approximately 36 µs for synchronizing a demodulator. Before the demodulator can be synchronized, however, the WCD may need to perform a number of tasks, including the task of removing DC components from the received signal. Conventional DC removal techniques used in voice communication typically provide continuous monitoring of a received signal, estimation of the DC offset, and closed-loop feedback to facilitate DC removal. However, the conventional techniques commonly used in voice communication systems may lack sufficient speed to satisfy the time constraints imposed by a WLAN system.

SUMMARY

In one embodiment, a wireless communication device (WCD) includes a receiver coupled to a modem. The receiver can quickly remove DC from an analog baseband signal associated with a received packet by accessing an estimated DC offset value stored locally in memory of the receiver. The modem may remove residual DC from a digital representation of the baseband signal using a residual DC removal loop. In addition, the modem may estimate the residual DC offset and update the memory of the receiver so that the receiver can remove a more appropriate amount of DC from subsequently received analog baseband signals.

Various embodiments may be implemented in software, hardware, firmware, or any combination thereof. Additional details of various embodiments are set forth in the accompanying drawings and the description below. Other features, objects and advantages will become apparent from the description and drawings, and from the claims.

DETAILED DESCRIPTION

Figure 1:
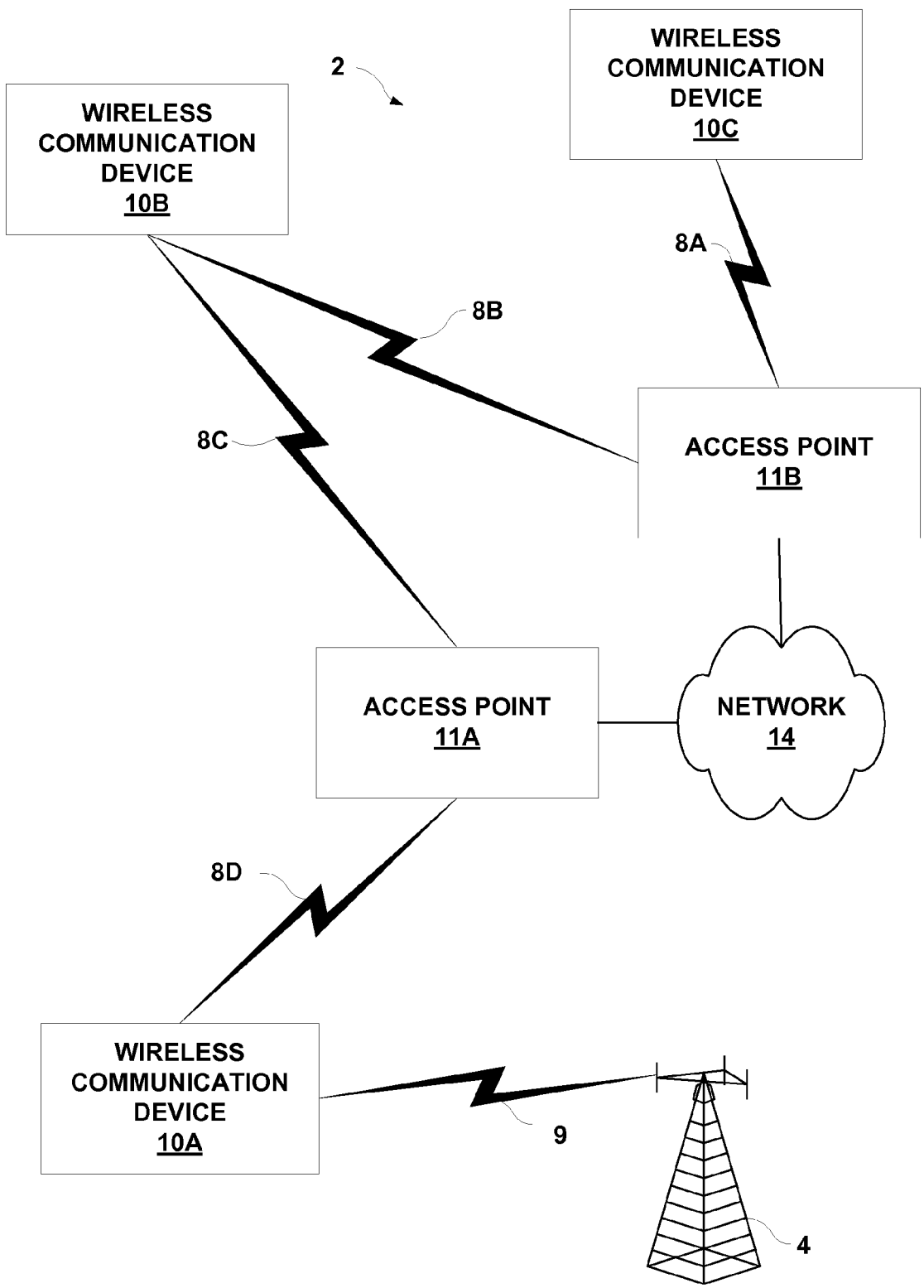
FIG. 1 is a block diagram illustrating a wireless communication system in which wireless communication devices (WCDs) can implement DC removal techniques.

In general, this disclosure describes a wireless communication device configured to perform various signal processing tasks associated with wireless data communication. More specifically, a wireless communication device (WCD) including a wireless LAN (WLAN) receiver may perform DC removal very quickly on a packet-by-packet basis. The receiver of the WCD may store DC offset values estimated during the processing of baseband signals associated with a previously received packet. These locally stored DC offset values can be used by the receiver to quickly remove relatively large DC offsets from an incoming baseband signal associated with a subsequently received packet. As a result, DC removal can be performed more quickly, and acquisition time may be reduced in a WLAN receiver.

During processing of a received baseband signal, a modem (modulator/demodulator) may estimate the DC offset, and use the estimate to update DC offset values stored locally on the receiver. In some cases, received signals may be processed according to one of a plurality of gain states. In that case, DC offset values may be stored on the receiver for each of the gain states. Thus, different DC offsets may be removed at the receiver, depending on the gain state associated with each received baseband signal. In other words, when a packet is received, it may be processed according to one of a plurality of gain states, and the locally stored DC offset value associated with the selected gain state can be applied to the baseband signal associated with the packet in order to remove DC very quickly.

DC removal is generally necessary because significant DC offsets can be introduced into the baseband signal during the mixing process (sometimes referred to as down conversion). Moreover, in a WLAN setting, the received signal is generally not a constant signal; rather, received packets are temporally separated. For this reason, DC removal presents significant challenges in a WLAN setting because temperature changes of signal processing components of the WCD, such as mixers, can significantly affect the amount of DC introduced into the baseband signal. In addition, the amount of DC introduced by the system may change significantly between the times when sets of packets are received. DC removal can be particularly challenging in settings that implement wireless standards for which the time allocated for DC removal is very short. The IEEE 802.11b, IEEE 802.11a, and IEEE 802.11g standards are three examples of such a wireless standard.

As described in greater detail below, the WCD may implement coarse DC removal techniques to remove relatively large DC components, as well as a fine DC removal techniques to remove residual DC components. The coarse DC removal can be achieved using memory, a DC digital-to-analog converter (DAC) and a difference amplifier incorporated in a receiver chip. The fine DC removal can be achieved using a DC estimation and removal loop on the modem chip. Estimations used to update coarse DC values stored in the receiver memory can also be calculated on the modem chip. Therefore, updates may be periodically sent from the modem chip to the coarse DC removal unit on the receiver chip via a serial bus.

The techniques may exploit wireless networking practices that operate according to a resend-until-acknowledged protocol. Accordingly, a received packet can be processed, and during the processing, the coarse DC removal unit can be updated. If the DC offset of the baseband signal associated with the received packet is too large, then analog-to-digital converters in the modem may saturate during processing of the received packet. In that case, processing of the packet will generally error-out. However, the packet will eventually be resent because the WCD will not return an acknowledgement to the sender for the packet that errored-out.

As a result, the sender will resend the packet, providing an opportunity to condition the incoming signal to remove a more appropriate portion of the DC component. Moreover, because the coarse DC removal unit is updated to adjust the DC offset value during the processing of the initial packet, the next time a copy of packet is received, the DC adjustments may be more likely to ensure that the baseband signal will fall within the range of the A/D converters. In some cases, the same packet may need to be received a plurality of times before the coarse DC value is within a range that will allow the packet to be processed without saturating the A/D converters. Nevertheless, the resend-until-acknowledged framework should ensure that the packet will continue to be sent until the coarse DC value is acceptable. Importantly, using values stored locally at the receiver, coarse DC removal at the receiver chip can be executed very quickly as required in some WLAN systems.

The techniques described below may yield a number of advantages. For example, the techniques may be used to significantly reduce the time it takes for DC removal on a received baseband signal by storing DC offset values locally on the receiver chip. Thus, coarse DC removal can be performed very quickly, simply by selecting the appropriate stored DC offset value and removing the value from the received baseband signal associated with the received packet. This is particularly important for wireless networks such as IEEE 802.11a IEEE 802.11b and IEEE 802.11g networks where the amount of time allocated for signal synchronization is extremely small. Accordingly, the techniques may be used to decrease the time associated with DC removal.

Also, additional techniques outlined in greater detail below can simplify the architecture by reducing the number of serial lines needed to transfer updated DC values between the modem and receiver. In any case, the values can be accessed locally by the receiver, reducing consumption of system bus clock cycles that would otherwise be necessary for communication with the modem. In addition, techniques for improving the estimation of the DC offset are also described, such that accumulation in the residual DC removal loop occurs at different rates during and after RF training. Such techniques can improve the effective signal-to-noise ratio of the demodulated signal.

FIG. 1 is a block diagram illustrating a wireless communication system 2 including a number of wireless communication devices 10A-10C, collectively referred to as wireless communication devices 10. Wireless communication devices (WCDs) 10 may be any portable computing device configured to support wireless networking. Each device may be, for example, a desktop or portable computer operating in a Windows™, Macintosh™, Unix, or Linux environment, a personal digital assistant (PDA) based on the Palm™, Windows CE, or similar operating system environments for small portable devices, or other wireless device such as a mobile radiotelephone, an interactive television, a wireless data terminal, a wireless data collection device, an Internet kiosk, a network-ready appliance for the home environment, a wireless server, and the like.

WCDs 10 communicate with one another in wireless communication system 2 via wireless signals 8A-8D (hereafter wireless signals 8). In particular, WCDs 10 may communicate according to a wireless protocol such as the protocol defined by a wireless standard, e.g. one of the standards in the IEEE 802.11 family of standards. Wireless signals 8 may be sent to and from the respective WCDs 10 by wireless access points 11A and 11B. The access points 11 may have wired connections to a network 14, such as a local area network, a wide area network, or a global network such as the Internet.

In addition, one or more WCDs 10 within system 2 may be configured to support one or more voice communication standards. For example, one or more base stations 4 may communicate voice data 9 to WCD 10A via voice communication techniques such as CDMA techniques, FDMA techniques, TDMA techniques, various combined techniques, and the like. For example, one or more of WCDs 10 may be designed to support one or more CDMA standards such as (1) the "TIA/EIA-95-B Mobile Station-Base Station Compatibility Standard for Dual-Mode Wideband Spread Spectrum Cellular System" (the IS-95 standard), (2) the "TIA/EIA-98-C Recommended Minimum Standard for Dual-Mode Wideband Spread Spectrum Cellular Mobile Station" (the IS-98 standard), (3) the standard offered by a consortium named "3rd Generation Partnership Project" (3GPP) and embodied in a set of documents including Document Nos. 3G TS 25.211, 3G TS 25.212, 3G TS 25.213, and 3G TS 25.214 (the W-CDMA standard), (4) the standard offered by a consortium named "3rd Generation Partnership Project 2" (3GPP2) and embodied in a set of documents including "TR-45.5 Physical Layer Standard for cdma2000 Spread Spectrum Systems," the "C.S0005-A Upper Layer (Layer 3) Signaling Standard for cdma2000 Spread Spectrum Systems," and the "C.S0024 CDMA2000 High Rate Packet Data Air Interface Specification" (the CDMA2000 standard), (5) the HDR system documented in TIA/EIA-IS-856, "CDMA2000 High Rate Packet Data Air Interface Specification, and (6) some other standards. In addition, WCDs 10 may be designed to support other standards, such as the GSM standard or related standards, e.g., the DCS1800 and PCS1900 standards. GSM systems employ a combination of FDMA and TDMA modulation techniques. WCDs 10 may also support other FDMA and TDMA standards.

Figure 2:
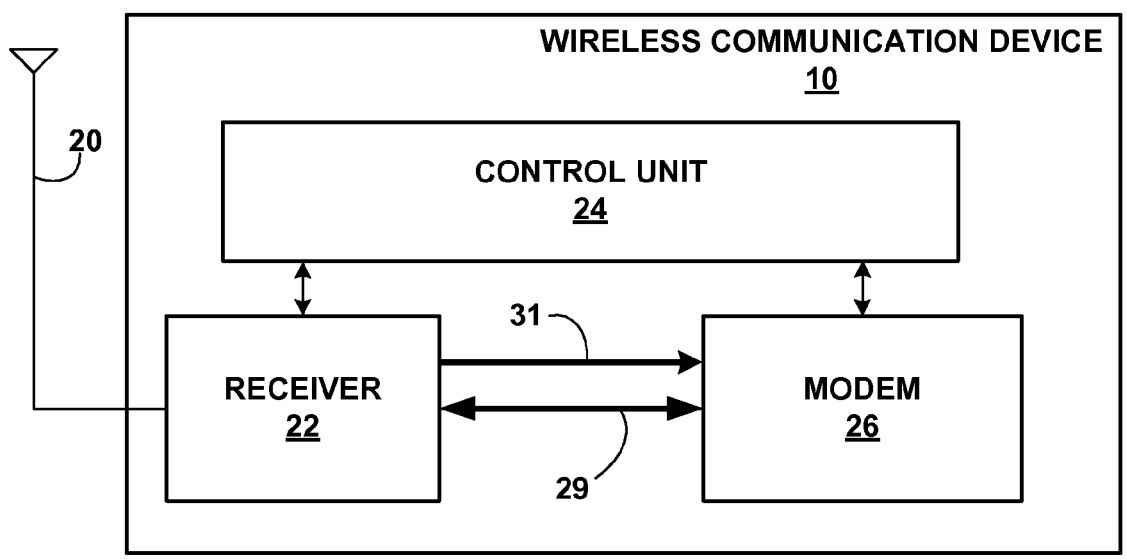
FIG. 2 is a block diagram of a WCD depicted in FIG. 1.

FIG. 2 is a block diagram of an exemplary WCD 10. As shown, WCD 10 includes an antenna 20 coupled to a receiver 22, a modem (modulator/demodulator) 26 coupled to the receiver 22 via serial bus 29 and analog transmission line 31, and a control unit 24 coupled to both the receiver 22 and the modem 26. Control unit 24 may form part of modem 26, but is illustrated separately for simplicity. In some cases, antenna 20 may be coupled to a duplexer (not shown), which is in turn coupled to both receiver 22 and a transmitter (not shown) that generates the wireless signals to be transmitted from the WCD 10. For simplicity, however, the duplexer and transmitter are not illustrated. In this disclosure, the term modem refers to a component or collection of components that can perform modulation, demodulation, or both modulation and demodulation.

Receiver 22 receives wireless RF signals in which data is modulated according to a modulation scheme, such as the BPSK or QPSK modulation schemes typically implemented by devices compliant with the IEEE 802.11b wireless networking standard or the OFDM modulation scheme typically implemented by devices compliant with the IEEE 802.11g wireless networking standard. In either case, the received information comes in the form of data packets encoded according to the modulation scheme used. Dividing the data into packets has several advantages including enabling the sending device to resend only those individual packets that may be lost or corrupted during transmission.

Wireless networks typically operate according to a resend-until-acknowledged protocol in which the packets are resent to WCD 10 until WCD 10 acknowledges receipt of the packet. The techniques outlined below may exploit this resend-until-acknowledged framework by recognizing that received packets may be used to adjust the stored DC offset values, so that later received packets can be properly processed. In other words, the techniques recognize that if the DC offset values are not precise enough to ensure that a first packet can be processed, the resend-until-acknowledged framework ensures that another copy of the packet will be sent again. Thus, the first packet can be used to adjust the DC offset values so that the second copy of the packet can be properly conditioned by the removing sufficient DC offsets, ensuring that the packet is eventually received and processed correctly. Importantly, the time it takes to perform DC removal on any given packet can be significantly reduced because DC offset information can be stored locally on receiver 22.

Receiver 22 receives RF waveforms via antenna 20. Receiver typically conditions the received waveform, such as by filtering or scaling the RF waveform and mixing the waveform down to baseband. For demodulation used in IEEE 802.11b wireless networks, receiver 22 generates baseband signals for I- and Q-components of the RF signal as is well known in the art. The I-component refers to the in-phase component of the complex waveform, whereas the Q-component refers to the quadrature-phase component of the complex waveform. In both cases, receiver 22 passes the baseband signal for the respective I- or Q-components of the complex waveform to modem 26 for demodulation. For example, I- and Q-baseband signals can be sent from receiver 22 to modem 26 via analog transmission line 31. Control unit 24 may send commands to receiver 22 and modem 26 to control the processing of the received packet.

The techniques outlined below may be duplicated in hardware for processing of both the I- and Q-baseband signals. For simplicity, however, the following description describes the processing of a baseband signal associated with a received packet. It is understood, that a baseband signal associated with a received packet may correspond to either a I- or Q-baseband signal, and that similar circuitry may be duplicated to process both the I- and Q-baseband signals in parallel. In accordance with other standards, a single baseband signal may be processed as outlined below, or multiple baseband signals representing various components of the signal may be processed as outlined below.

Modem 26 demodulates the received baseband signal. Depending on the encoding scheme with the data rate being used, modem 26 may implement demodulation techniques that exploit redundancy of the waveform used to encode the packet in order to increase processing speed. In any case, modem 26 demodulates the received packets in order to extract the payload of the packets for presentation to the user of WCD 10.

Figure 3:
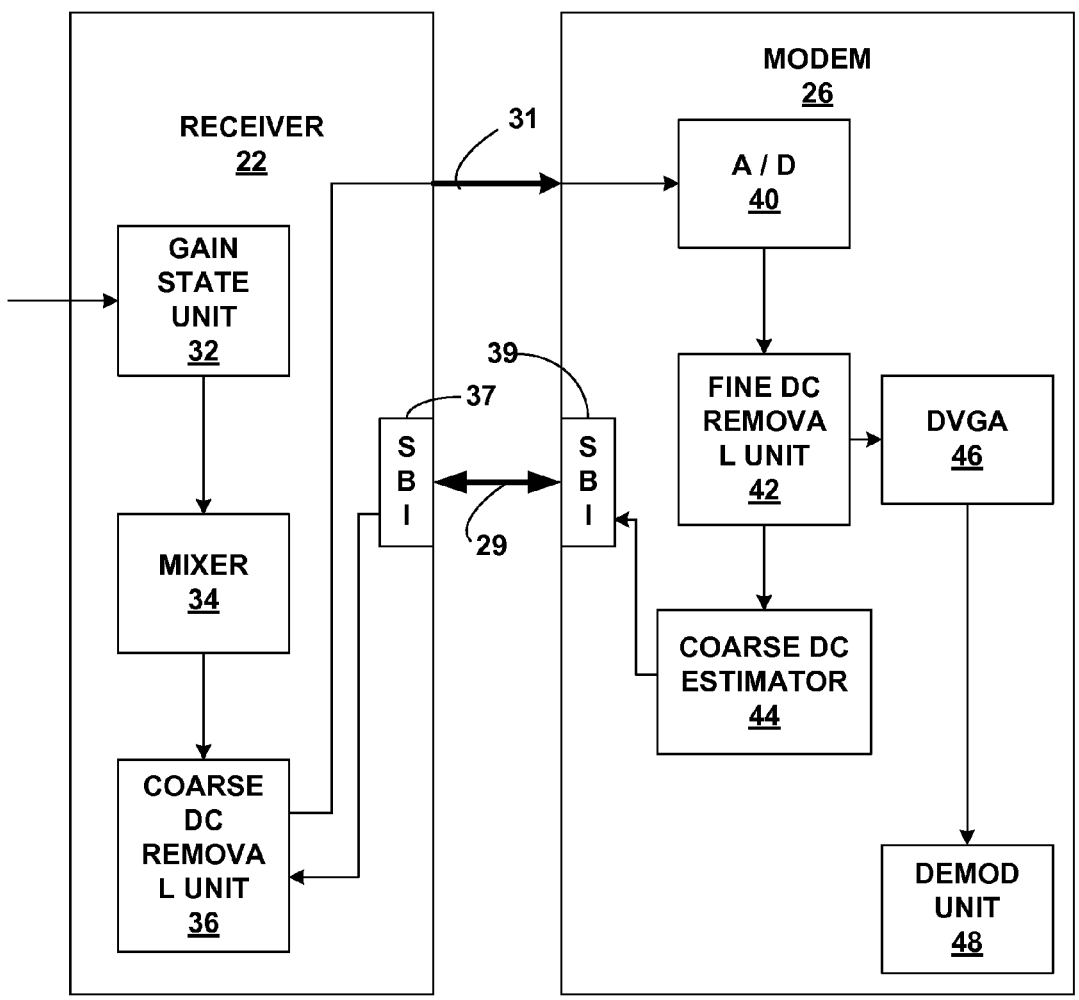
FIG. 3 is a more detailed block diagram of a receiver and modem of the WCD depicted in FIG. 2.

FIG. 3 is a block diagram illustrating in greater detail one implementation of receiver 24 coupled to modem 26. As shown, receiver 24 may include a gain state unit 32 that selects or stores a gain state for processing of a received packet. Gain state unit 32, for example, may select one of a plurality of gain states based on the power of the RF signal associated with the received packet. Alternatively, gain state unit 32 may receive and store an indication of a selected gain state. For example, power estimation techniques can be implemented in modem 26 to estimate the power of the received RF signal so that signals can be sent from modem 26 to gain state unit 32 via serial bus 29 to select the appropriate gain state.

The selected gain state coarsely defines the gain of one or more amplifiers (not shown) and possibly mixer 34. For example, higher power signals may be processed according to a lower gain state, whereas lower power signals may be processed according to a higher power gain state. In some embodiments, a single gain state may be used for all packets, and in other embodiments, any number of gain states can be implemented to improve the processing of signals of varying power levels. As outlined in greater detail below, DC estimation techniques can be used to estimate DC offsets and update local memory of receiver 22 with DC offset information for one or more gain states. In some cases, DC offset information can be updated at the same time gain state selection signals are sent from modem 26 to gain state unit 32.

Mixer 34 receives the RF signal and mixes it down to I- and Q-baseband signals. For example, mixer 34 may implement a frequency synthesizer that utilizes a local clock of WCD 10 as a timing reference. Thus, mixer 34 may remove the RF carrier component of the received RF signal to generate the baseband signals associated with the received packet. Again, although the following discussion describes the processing of a baseband signal associated with a received packet, it is understood that duplicative circuitry may be implemented for both I- and Q-baseband signals. As desired, receiver 22 may also include additional components such as various filters, amplifiers and the like.

Coarse DC removal unit 36 stores values indicative an estimated DC offset associated with the received baseband signal. For this reason, coarse DC removal unit 36 can quickly remove DC components from the baseband signal associated with the received packet within the time constraints imposed by certain WLAN standards. If WCD 10 operates according to a number of different gain states, coarse DC removal unit 36 may store DC offset values associated with each of the gain states. In that case, coarse DC removal unit 36 may select the appropriate DC offset value according to the gain state selected or stored in gain state unit 32 in order to remove the appropriate amount of DC from the baseband signal.

While the coarse DC removal unit 36 is removing a DC offset in the baseband signal associated with the received packet, the baseband signal is being sent to modem 26 for demodulation. For example, the baseband signals can be sent from receiver 22 to modem 26 via analog transmission line 31. Receiver 22 and modem 26 may also be coupled together by a serial bus 29. Accordingly, receiver 22 and modem 26 may each include a serial bus interface 37, 39 to facilitate data transmission over serial bus 29.

Upon receiving a baseband signal associated with a received packet, modem 26 converts the signal to a digital representation (referred to as a digital baseband signal). In particular, analog to digital (A/D) converter 40 samples a received analog baseband signal and produces the corresponding digital baseband signal. Fine DC removal unit 42 implements a DC removal loop to remove residual DC from the digital baseband signal. In addition, coarse DC estimator 44 estimates the residual DC offset associated with the baseband signal. After removing the residual DC from the digital baseband signal, fine DC removal unit 42 forwards the digital baseband signal to a digital variable gain amplifier (DVGA) 46. DVGA 46 can be used to scale the digital baseband signal, either by amplifying or attenuating the digital values. For example, the DVGA may be implemented in lieu of, or in addition to the implementation of various gain states. After scaling the digital baseband signal, DVGA 46 then forwards the scaled digital baseband signal to demodulation unit 48 for demodulation and data extraction.

Coarse DC estimator 44 is implemented to estimate the residual DC offset value associated with the received baseband signal. As mentioned, fine DC removal unit 42 also estimates the residual DC offset value and uses the estimation in order to remove the residual DC from the digital baseband signal. Coarse DC estimator 44, in contrast, estimates the residual DC offset value and uses the estimation to update the DC removal value stored in coarse DC removal unit 36 on receiver 22. Thus, coarse DC estimator 44 may not affect the digital baseband signal for which the estimation is made. Instead, coarse DC estimator 44 adjusts the DC removal value stored in coarse DC removal unit 36 so that the DC components removed from baseband signals associated with subsequently received packets will be more adequate.

For example, in some cases, upon receiving a first packet the coarse DC removal unit 36 will not remove enough DC to ensure that the packet can be processed. In that case, if the residual DC is too large, A/D converter 40 may saturate, thereby corrupting the digital baseband signal. The subsequent processing of the digital baseband signal may cause an error, for example, during demodulation. Therefore, WCD 10 will not return an acknowledgement to the sending device for that packet, and the sending device will send another duplicate copy pursuant to the send-until-acknowledged framework.

Furthermore, because coarse DC estimator 44 estimated the residual DC and adjusted the DC value stored in coarse DC removal unit 36, when the duplicate copy of the previously received packet is received and processed by receiver 22, coarse DC removal unit 36 will be more likely to remove sufficient DC, ensuring that the packet can be processed without saturating A/D converter 40. In some cases, the same packet may need to be received a plurality of times before the coarse DC value is within a range that will allow the packet to be processed without saturating the A/D converter 40. Nevertheless, the resend-until-acknowledged framework should ensure that the packet will continue to be sent until the coarse DC value is acceptable. In most cases, the coarse DC value will quickly converge the an acceptable value and packets will be processed quickly and efficiently.

Modem 26 may also perform one or more power detection techniques in order to assess whether the current gain state is adequate. In that case, updates to the DC offset values stored locally on receiver 22 may be made at the same time that signals are sent from modem 26 to receiver 22 to set or adjust the gain state.

Figure 4:
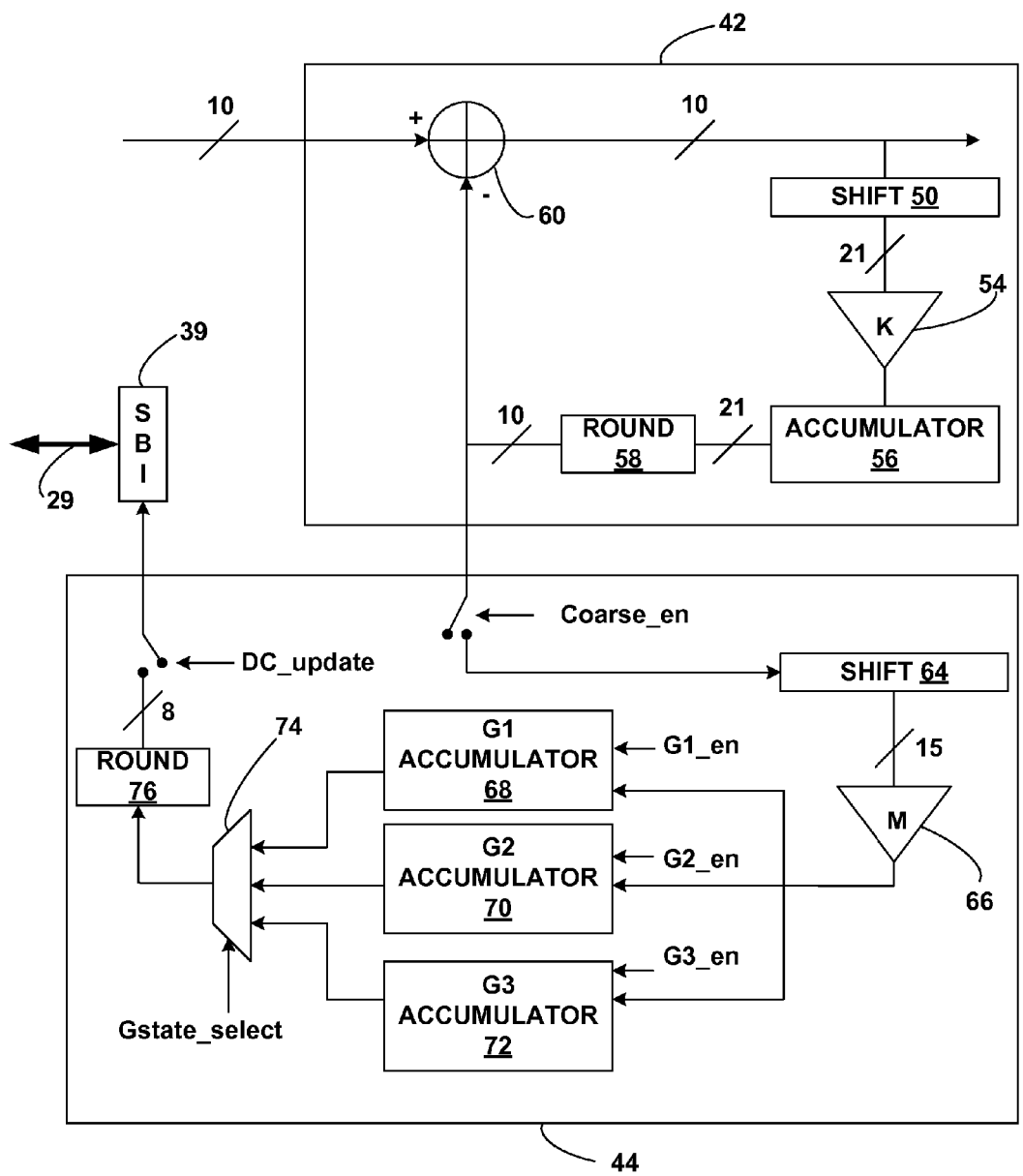
FIG. 4 is a more detailed block diagram of a fine DC removal unit and coarse DC estimator that form part of the modem depicted in FIG. 3.

FIG. 4 is a more detailed block diagram of an exemplary implementation of fine DC removal unit 42 and coarse DC estimator 44. As illustrated, fine DC removal unit 42 receives the digital baseband signal from A/D converter 40 (FIG. 3) in the form of 10-bit values. Other sized A/D converters could also be used. A residual DC removal loop is implemented within fine DC removal unit 42 to remove residual DC components from the digital baseband signal. For example, as illustrated, the 10-bit value can be shifted 50, scaled 54 and accumulated 56 to provide an ongoing estimate of the residual DC in the baseband signal. The residual DC offset value is stored and accumulated in accumulator 56. Then, the accumulated estimate of the residual DC offset can be rounded 58 and removed from subsequent 10-bit values of the digital baseband signal as shown by adder 60. In other words, accumulator 56 stores the residual DC offset correction value, which is used to remove DC from the digital baseband signal.

The residual DC offset correction value typically converges to the correct DC correction value after iterations of the loop. With a larger portion of the DC component removed, the baseband signal should modulate around an amplitude of zero. Thus, by accumulating the signal amplitude, and removing the accumulated amplitude each iteration of the loop, the residual DC can be removed from the baseband signal as shown in FIG. 4.

The gain (K) of the residual loop can be selected based on the desired operation of the loop. For example, a relatively large value of K, such as K on the order of approximately $2^{(-3)}$ can result in very fast convergence of the loop, e.g., less than approximately 10 μsec. As the value of K is increased, the time constant associated with loop convergence may also increase, but the effective signal-to-noise ratio after demodulation may be improved. Accordingly, the value of K may be selected or defined with these offsetting factors in mind.

In some cases, K may be initially set to be relatively large, such as a value of K of approximately $2^{(-3)}$ during an RF training interval on the order of 20 μsec to ensure quick convergence of the loop. Then, K may be changed to a relatively small gain value such as approximately $2^{(-5)}$ or approximately $2^{(-9)}$ after the RF training interval. In this manner, benefits associated with quick convergence of the loop and decreased effective signal-to-noise after demodulation may both be realized.

At some point following convergence of the residual DC correction loop within fine DC removal unit 42, control unit 24 (FIG. 2) may enable a coarse DC estimation loop within coarse DC estimator 44. For example, control unit 24 may send a coarse loop enable signal (coarse_en) to enable the estimation of the residual DC offset by coarse DC estimator 44. The coarse DC estimation loop within coarse DC estimator may operate similar to the residual DC estimation loop within fine DC removal unit 42. For example, as illustrated, the 10-bit residual DC estimate from value received from fine DC removal unit 42 can be shifted 64, amplified 66, and accumulated to provide an ongoing estimate of the residual DC. In the illustrated implementation, separate accumulators 68, 70, 72 are provided for each of three possible gain states. As mentioned above, control unit 24 may be implemented within modem 26, or may be a separate component as illustrated in FIG. 2.

Any number of gain states, and thus any number of accumulators may be used. As illustrated in FIG. 4, however, when multiple gain states are supported, the accumulator associated with the current gain state can be enabled to form part of the coarse DC estimation loop. In other words, control unit 24 (FIG. 2) can enable the appropriate accumulator via accumulator enable signals (G1_en, G2_en, or G3_en). Thus, an estimation for the DC offset can be accumulated for the particular gain state associated with the current baseband signal being processed. Multiplexer 74 can be implemented to select the appropriate accumulator. For example, control unit 24 (FIG. 2) can provide a gain state select signal (Gstate_select) to multiplexer 74 to indicate which of the three accumulators are enabled. The output of multiplexer 74 can then be rounded before updating the coarse DC removal unit 36 as described below.

The gain (M) of the coarse DC estimation loop can be selected based on the desired operation of the loop, and the operation parameters of DC digital-to-analog converter (DC DAC) used in the coarse DC removal unit 36 as outlined below. Typically, M may have a value between approximately 1 and $2^{(-5)}$. For example, an M value on the order of approximately $2^{(-3)}$ may be appropriate for most situations.

Coarse DC estimator 44 estimates the residual DC offset associated with a received baseband signal and updates coarse DC removal unit 36 (FIG. 3) so that subsequently received baseband signals associated with subsequently received packets will have the appropriate amount of DC removed by receiver 22. Again, in the illustrated example, coarse DC estimator 44 accumulates a DC estimate specifically for a selected one of a plurality of gain states. This accumulation process may continue until the packet has been completely forwarded from fine DC removal unit 42 to DVGA 46 and demodulation unit 48. At that point, control unit 24 (FIG. 2) may enable coarse DC estimator 44 to update coarse DC removal unit 36 (FIG. 3), such as by providing a DC update signal (DC_update) to coarse DC estimator 44. Then, coarse DC removal unit 36 can send an update to coarse DC estimator 44 via serial bus 29. In other implementations, each accumulator may have its own dedicated serial bus. However, the implementation using the same serial bus for all accumulators can save significant real estate for the circuit. In still other cases, DC offset values for every gain state may be updated upon processing each packet.

Figure 5:
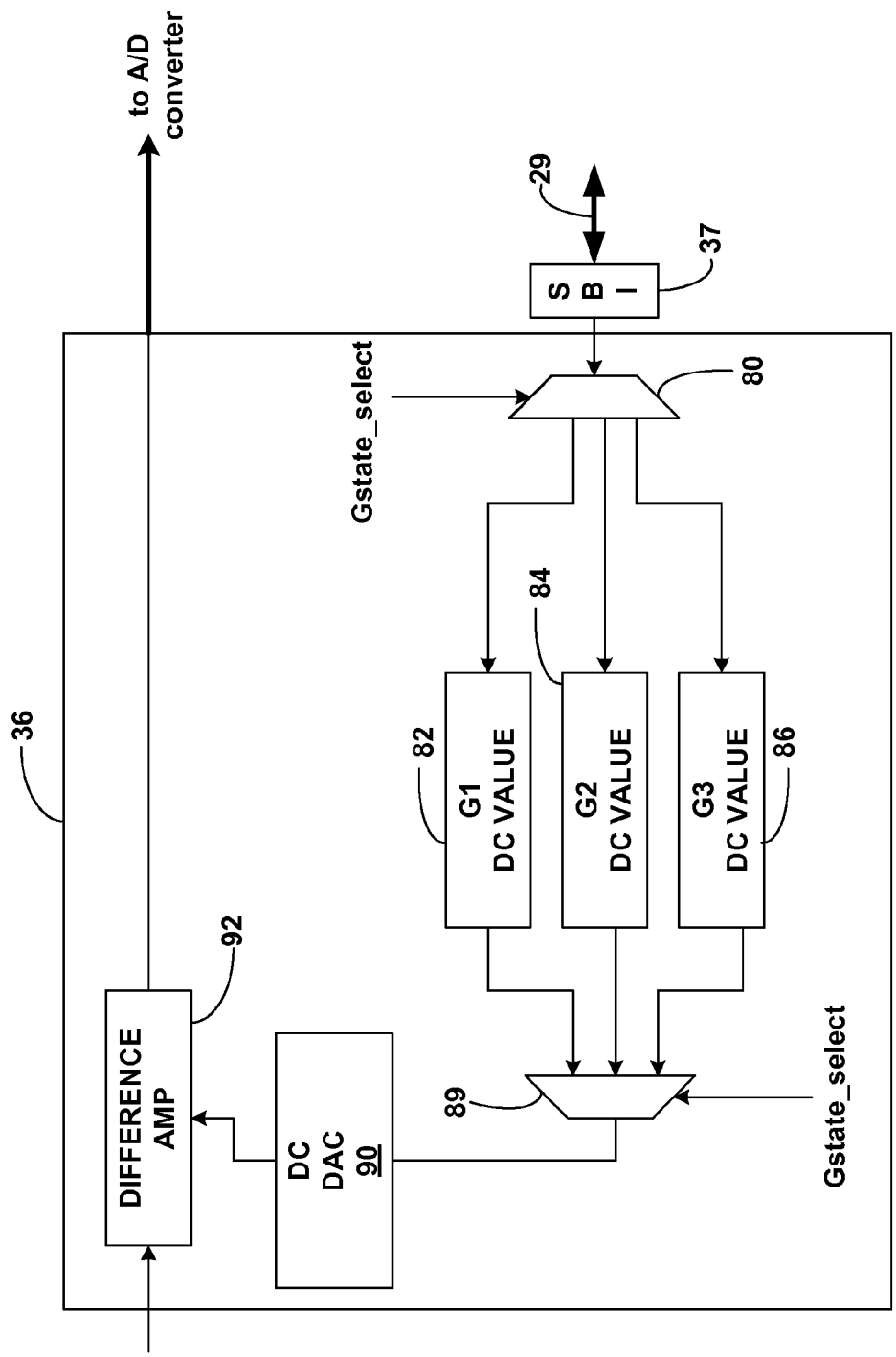
FIG. 5 is a more detailed block diagram of the coarse DC removal unit that forms part of the receiver depicted in FIG. 3.

FIG. 5 is a more detailed block diagram of an exemplary implementation of coarse DC removal unit 36 capable of receiving updates from the coarse DC estimator 44 illustrated in FIG. 4. In particular, coarse DC removal unit 36 may periodically receive updated offset values for the different gain states associated with the respective baseband signal being processed. For example, coarse DC removal unit 36 may receive an update from coarse DC estimator 44 via serial bus 29. Control unit 24 may provide a signal indicative of the gain state associated with the received updates (Gstate_select) so that multiplexer 80 can select and forward the update to the appropriate local memory associated with the appropriate gain state. In other words, DC removal unit 36 may maintain separate DC offset values for each of the plurality of gain states. For example, the memory may be allocated for storing a DC value for a first gain state 82, a DC value for a second gain state 84, a DC value for a third gain state 86, and so forth. These stored values may be digital values as provided by coarse DC estimator 44. Also, in some cases the updates may be provided to coarse DC removal unit 36 in receiver 22 at the same time that control unit 24 or modem 26 updates or adjusts the gain state according to one or more power estimations.

When packets are received by receiver 22 and mixed down to baseband signals, receiver 22 can perform DC removal very quickly because the DC offset values are stored locally in memory 82, 84, 86. Moreover, the stored DC offset values may correspond to estimates that were made by the coarse DC estimator 44 on modem 26 or a recently received packet. The DC offset values stored locally in memory 82, 84, 86, should converge to values that will ensure that the packets can be processed without saturating analog-to-digital converter 40.

DC can be removed from analog baseband signals within receiver 22 by implementing a DC digital-to-analog converter (DC DAC) 90. In particular, when an analog baseband signal associated with a received packet is generated by mixer 34 and forwarded to coarse DC removal unit 36 (FIG. 3), control unit 24 (FIG. 2) sends Gstate_select control signal to multiplexer 89. Multiplexer 89 selects and forwards the appropriate DC offset value, as determined by the gain state, to DC DAC 90. DC DAC 90 converts the digital DC offset value to an analog representation of the DC offset. DC DAC 90 then applies the analog representation of the DC offset using difference amplifier 92 which removes the DC offset from the received baseband signal before sending the received baseband signal to modem 26 via analog transmission line 31. Importantly, because the DC offset information is stored and updated locally on receiver 22, DC removal can be performed very quickly as required by some WLAN systems. Thus, upon receiving a packet and selecting the gain state, DC removal can be performed immediately at receiver 22 simply by accessing the stored DC value associated with the selected gain state.

Figure 6:
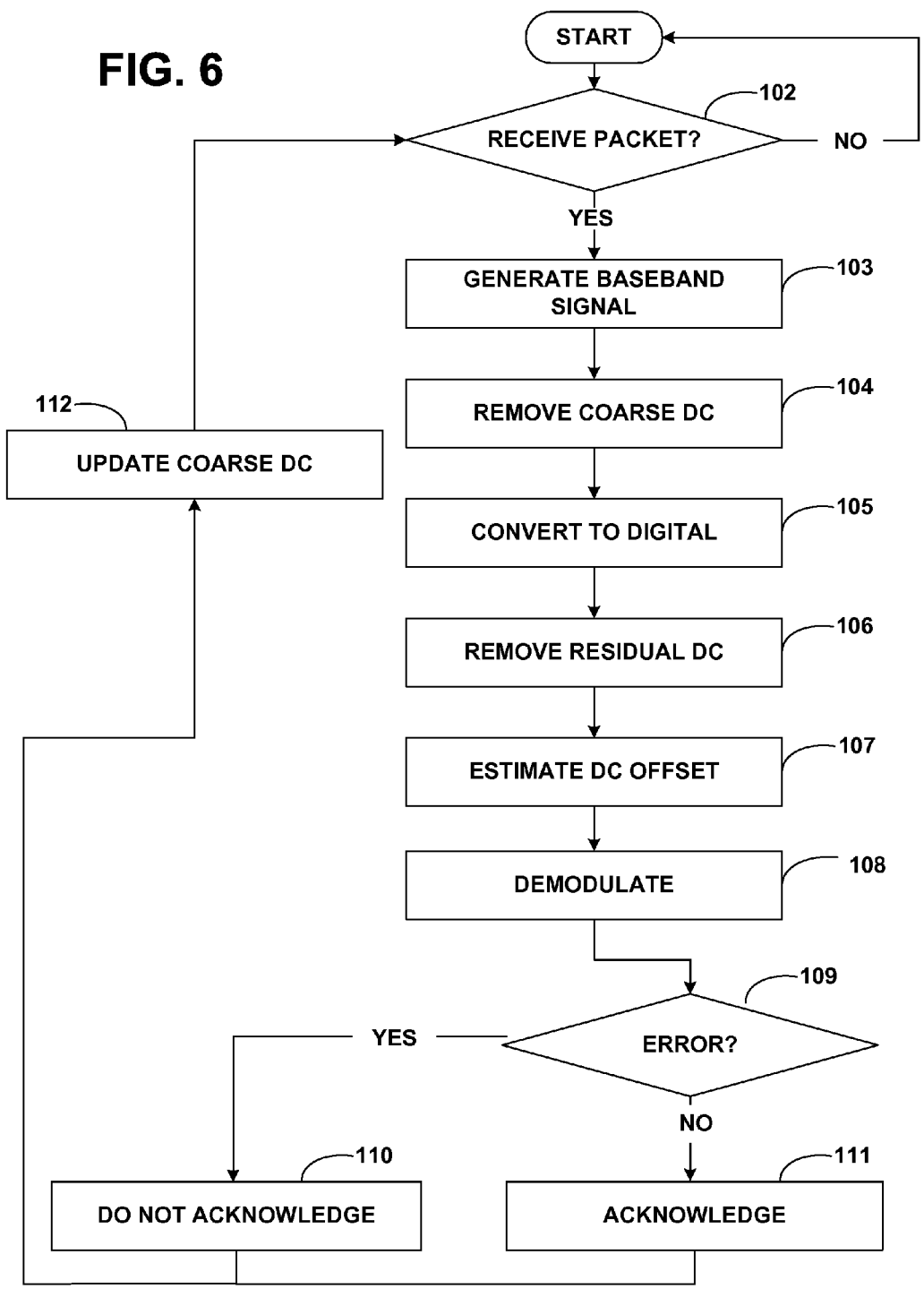
FIG. 6 is a flow diagram illustrating DC removal techniques that can be implemented in a WCD.

FIG. 6 is a flow diagram illustrating one embodiment of DC removal techniques that remove DC components from baseband signals on a packet-by-packet basis. As shown, when a packet is received (yes branch of 102), receiver 22 generates one or more baseband signals associated with the packet (103). In addition, receiver 22 removes an amount of DC from the baseband signal (104), such as by accessing a coarse DC value stored in memory, converting the coarse DC value to an analog DC signal and subtracting the converted analog signal from the baseband signal. Receiver 22 may then send the baseband signal to modem 26, where the baseband signal is converted to a digital baseband signal (105) and residual DC is removed (106). In addition to removing the residual DC, modem 26 estimates the residual DC (107) so that the coarse DC value stored on the receiver can be updated at a later time. Modem then demodulates the baseband signal (108) and determines whether the packet was received and processed without error. If modem 26 identifies an error for the packet (yes branch of 109), WCD 10 does not send an acknowledgement to the sending device (110). In that case, the sending device should resend the packet. If modem 26 does not identify an error, however, WCD 10 sends an acknowledgement to the sending device to indicate that the packet was received (111).

As mentioned, when modem is removing the residual DC (106), it may also estimate the DC offset (107). Then, after demodulation, modem 26 sends an updated coarse DC value to receiver 22 (112). In this manner, when a subsequent packet is received (yes branch of 102), receiver 22 generates one or more baseband signals for the subsequent packet (103) and removes an amount of DC from the baseband signal (104) according to the updated coarse DC value provided by modem 26. In other words, the residual DC estimated during the processing of a baseband signal associated with a first packet, will be removed by the receiver 22 when a subsequent baseband signal associated with a second packet is processed. Similarly, the residual DC estimated during the processing of a baseband signal associated with the second packet, will be removed by the receiver 22 when a subsequent baseband signal associated with a third packet is processed, and so forth.

In some cases, an error may occur for a received packet (yes branch of 109) specifically because not enough DC was removed by receiver 22. However, WCD 10 will not send an acknowledgment in that case (110). Thus, another copy of the packet should be received in the near future because of the resend-until-acknowledged framework. Moreover, because the coarse DC value stored in receiver 22 is updated (112), removal of coarse DC from a baseband signal associated with a later received copy of the same packet may be sufficient to ensure that the second copy can be processed without causing an error. In some cases, the same packet may need to be received a plurality of times before the coarse DC value is within a range that will allow the packet to be processed without saturating the A/D converter. Nevertheless, the resend-until-acknowledged framework should ensure that the packet will continue to be sent until the coarse DC value is acceptable. Importantly, coarse DC removal at the receiver can be executed very quickly as required in some WLAN systems.

Various techniques for performing DC removal have been described as being implemented in hardware. Example hardware implementations may include implementations within a DSP, an application specific integrated circuit (ASIC), a field programmable gate array (FPGA), a programmable logic device, specifically designed hardware components, or any combination thereof. In addition, various other modifications may be made without departing from the spirit and scope of the invention. Accordingly, these and other embodiments are within the scope of the following claims.

The invention claimed is:

1. A method comprising:
   estimating a DC offset value for a baseband signal associated with a first received packet;
   updating a memory of a receiver with the estimated DC offset value;
   removing a DC offset from a baseband signal associated with a second received packet according to the estimated DC offset value stored in memory;
   storing a plurality of DC offset values corresponding to a number of different gain states; and
   selecting, utilizing a multiplexer, one of the plurality DC offsets for processing a received baseband signal associated with a packet according to a selected one of the plurality of gain states.

2. The method of claim 1, further comprising processing the first received packet according to a selected one of a plurality of gain states, updating the memory associated with the selected gain state, and processing the second received packet according to the selected gain state.

3. The method of claim 2, further comprising:
   estimating a DC offset value for a baseband signal associated with a third received packet, wherein the third received packet is processed according to a different gain state than the first received packet;
   updating the memory of the receiver with the estimated DC offset value for the baseband signal associated with the third received packet, wherein the memory updated with the estimated DC offset value for the baseband signal associated with the third received packet is associated with the different gain state; and
   removing a DC offset from a baseband signal associated with a fourth received packet according to the estimated DC offset value in the memory associated with the different gain state.

4. The method of claim 1, further comprising updating a DC offset value corresponding to a selected gain state after processing a received baseband signal according to the selected gain state.

5. The method of claim 1, further comprising removing a residual DC offset from the baseband signal associated with the second received packet using a residual DC removal loop.

6. The method of claim 5, further comprising adjusting a gain of the residual DC removal loop after an RF training period.

7. The method of claim 1, further comprising:
   removing a DC offset from an analog baseband signal associated with a received packet according to an estimated digital DC offset value stored in memory; and
   removing a residual DC offset from a digital representation of the baseband signal using a residual DC removal loop.

8. The method of claim 7, wherein removing the DC offset from the analog baseband signal comprises converting a stored digital DC offset value to an analog DC offset signal and removing the analog DC offset signal from the analog baseband signal.

9. The method of claim 1, further comprising:
   processing a received baseband signal associated with a packet according to a selected one of the plurality of gain states; and removing a DC offset from the received baseband signal according to a stored DC offset value corresponding to the selected gain state.

10. The method of claim 9, further comprising removing a residual DC offset from a digital representation of the baseband signal using a residual DC removal loop.

11. The method of claim 9, further comprising:
estimating the DC offset associated with the received baseband signal; and
updating the stored DC offset value associated with the selected gain state based on the estimated DC offset.

12. The method of claim 11, wherein the received baseband signal is a first received baseband signal associated with the first received packet, the method further comprising processing a second received baseband signal associated with the second received packet according to the selected one of the plurality of gain states, and removing a DC offset from the second received baseband signal according to the updated value associated with the selected gain state.

13. A receiver comprising:
a memory that stores a digital representation of a coarse DC offset value;
a DC digital to analog converter that converts the stored digital representation to an analog DC offset signal;
a difference amplifier that removes the analog DC offset signal from a received baseband signal associated with a packet, wherein the memory stores digital representations of a plurality of coarse DC offset values associated with a plurality of gain states, and wherein the receiver selects, utilizing a multiplexer, one of the representations of the plurality DC offsets for processing a received baseband signal associated with a packet according to a selected one of the plurality of gain states.

14. A wireless communication device comprising:
a receiver that removes a DC offset from an analog baseband signal associated with a received packet according to an estimated digital DC offset value stored in memory; and
a modem that removes a residual DC offset from a digital representation of the baseband signal using a residual DC removal loop, wherein the memory is external to the modem.

15. The wireless communication device of claim 14, wherein the receiver removes the DC offset from the analog baseband signal by converting a stored digital DC offset value to an analog DC offset signal and removing the analog DC offset signal from the analog baseband signal.

16. A wireless communication device comprising:
a receiver that stores a plurality of DC offset values for a number of different gain states in memory external to a modem of the wireless communication device, processes a received baseband signal associated with a packet according to a selected one of the plurality of gain states, and removes a DC offset from the received baseband signal according to a stored DC offset value associated with the selected gain state.

17. The wireless communication device of claim 16, further comprising a modem coupled to the receiver that removes a residual DC offset from a digital representation of the baseband signal using a residual DC removal loop.

18. The wireless communication device of claim 16, wherein the modem updates the stored DC offset value associated with the selected gain state based on an estimated DC offset associated with the received baseband signal.

19. An apparatus comprising:
means for removing a DC offset from an analog baseband signal associated with a received packet according to an estimated digital DC offset value stored in memory, wherein the memory stores a plurality of estimated DC offset values associated with a plurality of gain states, and wherein the means for removing the DC offset selects, utilizing a multiplexer, one of the plurality of estimated DC offset values for processing a received baseband signal associated with the received packet according to a selected one of the plurality of gain states; and
means for removing a residual DC offset from a digital representation of the baseband signal using a residual DC removal loop.

* * * * *